(12) United States Patent
Losiewicz

(10) Patent No.: US 11,890,856 B2
(45) Date of Patent: Feb. 6, 2024

(54) SQUEEGEE DRIP COLLECTION SYSTEM FOR STENCIL PRINTER

(71) Applicant: Illinois Tool Works Inc., Glenview, IL (US)

(72) Inventor: William A. Losiewicz, Douglas, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 18/078,145

(22) Filed: Dec. 9, 2022

(65) Prior Publication Data

US 2023/0109169 A1 Apr. 6, 2023

Related U.S. Application Data

(62) Division of application No. 17/469,993, filed on Sep. 9, 2021, now Pat. No. 11,554,580.

(51) Int. Cl.
  *B41F 15/44* (2006.01)
(52) U.S. Cl.
  CPC .................................. *B41F 15/44* (2013.01)
(58) Field of Classification Search
  CPC .......... B41F 15/34; B41F 15/44; B41F 15/36; B41F 15/42; B41F 15/0881; B41M 1/12; B41N 1/248; H05K 1/092; H05K 3/1216; B41P 2215/50
  See application file for complete search history.

(56) References Cited

U.S. PATENT DOCUMENTS

2020/0253433 A1* 8/2020 Bussell ..................... A47L 1/06

FOREIGN PATENT DOCUMENTS

| CN | 111873612 A | * 11/2020 | ............. B41F 15/08 |
|---|---|---|---|
| CN | 111873612 A | 11/2020 | |
| CN | 113561633 A | 10/2021 | |
| DE | 19516070 A1 | * 11/1996 | ............. B41F 13/08 |
| EP | 1035940 A1 | 9/2000 | |
| JP | 62132643 | 6/1987 | |
| JP | 62132643 A | * 6/1987 | |
| JP | H0715340 A | 1/1995 | |
| JP | 2011255614 A | 12/2011 | |
| JP | 2017071072 A | * 4/2017 | |
| JP | 2017071072 A | 4/2017 | |

(Continued)

OTHER PUBLICATIONS

International Search Report and Written Opinion from International Application No. PCT/US2022/037674 dated Nov. 22, 2022.

*Primary Examiner* — Christopher E Mahoney
*Assistant Examiner* — Marissa Ferguson-Samreth
(74) *Attorney, Agent, or Firm* — Lando & Anastasi, LLP

(57) ABSTRACT

A squeegee drip collection system is configured to receive assembly material from at least one squeegee blade of the print head assembly. The squeegee drip collection system includes a paste shield coupled to the print head gantry and configured to be moved between a retracted position in which the paste shield is spaced from the at least one squeegee blade and an extended position in which the paste shield is positioned under the at least one squeegee blade. The squeegee drip collection system further includes a paste shield removal assembly configured to uncouple the paste shield from the print head gantry and to remove the paste shield.

11 Claims, 9 Drawing Sheets

(56) References Cited

FOREIGN PATENT DOCUMENTS

| JP | 2020104449 A | 7/2020 | |
| WO | 9924211 A1 | 5/1999 | |
| WO | WO-2018105016 A1 * | 6/2018 | .......... B41F 15/0881 |
| WO | 2019234820 A1 | 12/2019 | |
| WO | 2020252115 A1 | 12/2020 | |

* cited by examiner

SQUEEGEE DRIP COLLECTION SYSTEM FOR STENCIL PRINTER

CROSS-REFERENCE TO RELATED APPLICATION

This application claims priority under 35 U.S.C. § 121 as a Division of U.S. application Ser. No. 17/469,993, titled "SQUEEGEE DRIP COLLECTION SYSTEM FOR STENCIL PRINTER," filed Sep. 9, 2021, which is incorporated herein by reference in its entirety for all purposes.

BACKGROUND OF THE DISCLOSURE

1. Field of Invention

This application relates generally to stencil printers and related methods to print viscous materials, e.g., solder paste, on an electronic substrate, e.g., a printed circuit board (PCB), and more particularly to systems and methods for catching and containing excess material that drips from a squeegee blade during operation.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying a vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on a bottom surface of the stencil is removed in a cleaning process before additional circuit boards are printed.

One issue is preventing solder paste from dripping off the squeegee blades during operation and contaminating the operational workspace. During operation, solder paste can inadvertently drip off of the squeegee blades when traversing the stencil printer, falling on the stencil or the electronic substrate support.

SUMMARY OF THE DISCLOSURE

One aspect of the present disclosure is directed to a stencil printer for printing an assembly material on an electronic substrate. In one embodiment, the stencil printer comprises a frame, a stencil coupled to the frame, the stencil having apertures formed therein, and a support assembly coupled to the frame, the support assembly being configured to support the electronic substrate. The stencil printer further comprises a print head gantry coupled to the frame, a print head assembly supported by the print head gantry in such a manner that the print head assembly is configured to traverse the stencil during print strokes, and a squeegee drip collection system configured to receive assembly material from at least one squeegee blade of the print head assembly. The squeegee drip collection system includes a paste shield coupled to the print head gantry and configured to be moved between a retracted position in which the paste shield is spaced from the at least one squeegee blade and an extended position in which the paste shield is positioned under the at least one squeegee blade. The squeegee drip collection system further includes a paste shield removal assembly configured to uncouple the paste shield from the print head gantry and to remove the paste shield.

Embodiments of the stencil printer further may include the paste shield having a flat bottom wall, a front wall, a back wall and two side walls that create a shallow receptacle to receive solder paste from the at least one squeegee blade. The print head gantry may include an elongate beam that rides along rails provided on the frame. The elongate beam of the print head gantry may include at least one linear bearing that extends in a horizontal direction. The paste shield removal assembly may include at least one tooling member configured to move laterally on the at least one linear bearing. The at least one tooling member may include a downwardly extending pin having an end configured to be received within a receiving feature associated with the paste shield. The paste shield may include at least one receiving feature configured to be engaged by the pin of the at least one tooling member to engage and move the paste shield. The at least one tooling member may include two spaced-apart tooling members, each including a pin, a first tooling member being configured to move laterally on a first linear bearing and a second tooling member being configured to move laterally on a second linear bearing. The at least one receiving feature may include two receiving features, one for each tooling member, with the first and second tooling members being received in respective receiving features of the paste shield to releasably secure the paste shield. The squeegee drip collection assembly further may include at least one extension mechanism configured to move the paste shield between the retracted position and the extended position. The at least one extension mechanism may include a bracket secured to the print head gantry and an extension member that is mounted on the bracket. The extension member may include a cylinder mounted to the bracket and a rod that is reciprocally received within the piston. Each rod may include an end that is received within at least one receiving feature of the paste shield. The paste shield may be configured with a spring-loaded locking mechanism to secure the paste shield to the at least one extension mechanism within the at least one receiving feature. The stencil printer further may include a controller coupled to the print head gantry, the print head assembly and the squeegee drip collection system. The controller may be configured to control the movement of the paste shield between the retracted position and the extended position and to perform an operation to replace the paste shield.

Another aspect of the present disclosure is directed to a method of removing a paste shield configured to collect assembly material from a squeegee of a print head gantry. In one embodiment, the method comprises: positioning at least one tooling member adjacent at least one receiving feature of a paste shield; moving the paste shield toward the at least one tooling member by at least one extension mechanism; positioning the at least one tooling member within the at least one receiving feature of the paste shield to release the paste shield from the at least one extension mechanism; and supporting the paste shield with the at least one tooling member.

Embodiments of the method further include positioning the at least one tooling member within the at least one receiving feature includes positioning a downwardly extending pin of at least one tooling member within the receiving feature and triggering a spring-loaded locking mechanism to release the paste shield from the at least one extension mechanism. The at least one tooling member may include two spaced-apart tooling members, each including a pin. The at least one receiving feature may include two receiving features, with the two tooling members being received in respective receiving features of the paste shield to secure the paste shield. The at least one extension mechanism may include a bracket secured to the print head gantry and an extension member that is mounted on the bracket. The at least one extension member may include a cylinder mounted to the bracket and a rod that is reciprocally received within the piston, each rod having a head that is received within a receiving feature of the paste shield. The paste shield may be configured with a spring-loaded locking mechanism to secure the paste shield to the at least one extension mechanism.

Yet another aspect of the present disclosure is directed to a squeegee drip collection system configured to receive assembly material from at least one squeegee blade of the print head assembly. The squeegee drip collection system includes a paste shield coupled to the print head gantry and configured to be moved between a retracted position in which the paste shield is spaced from the at least one squeegee blade and an extended position in which the paste shield is positioned under the at least one squeegee blade. The squeegee drip collection system further includes a paste shield removal assembly configured to uncouple the paste shield from the print head gantry and to remove the paste shield.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
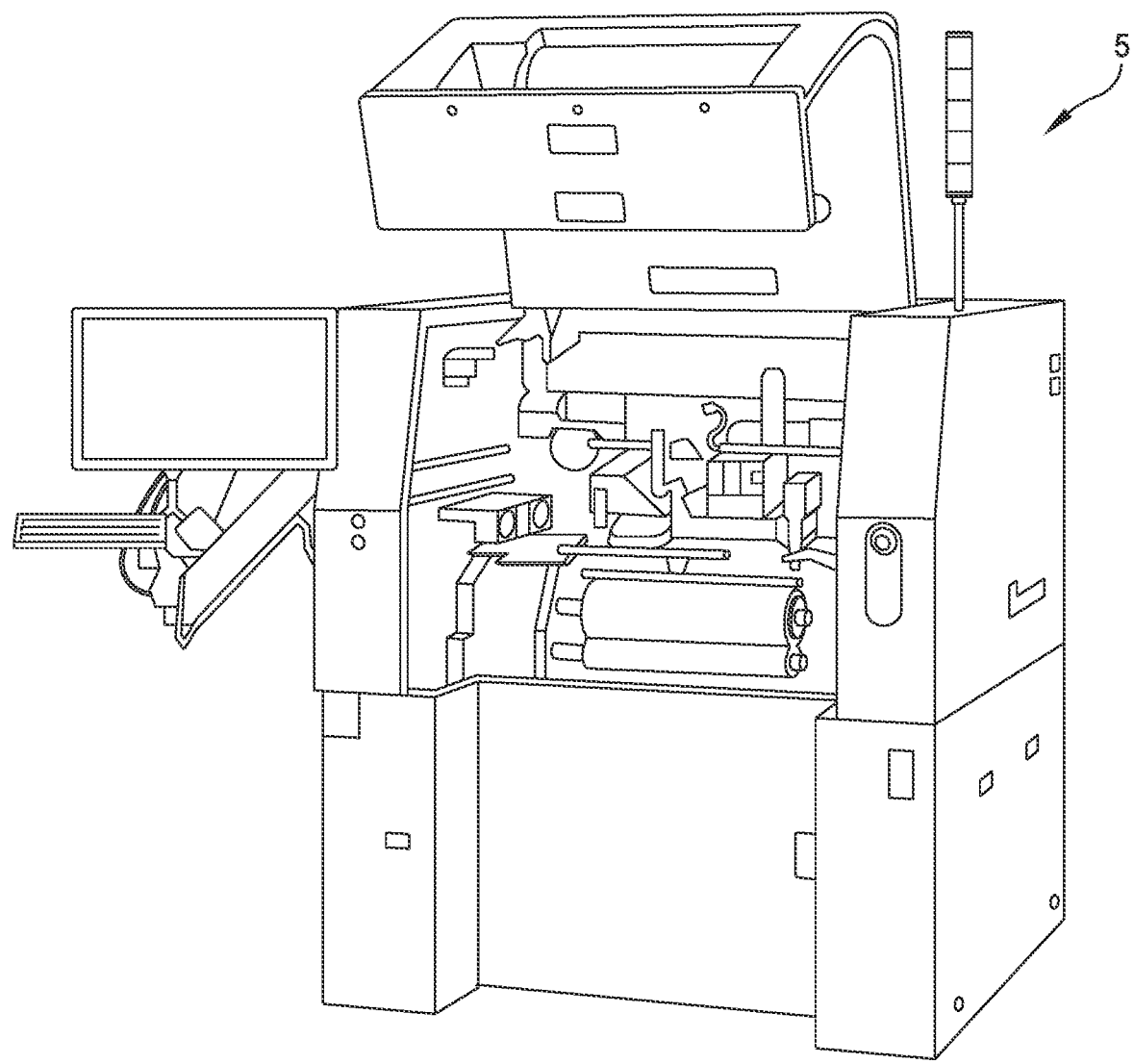
FIG. 1 is a front view of a stencil printer.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Embodiments of the present disclosure will now be described with reference to a stencil printer used to print an assembly material, such as solder paste, onto a circuit board. One skilled in the art will appreciate, however, that embodiments of the present disclosure are not limited to stencil printers that print solder paste onto circuit boards, but rather, may be used in other applications requiring dispensing of other viscous assembly materials, such as glues and encapsulents. For example, the apparatus may be used to print epoxy for use as underfill for chip-scale packages. Further, stencil printers in accordance with embodiments of the present disclosure are not limited to those that print assembly materials on circuit boards, but rather, include those used for printing other materials on a variety of substrates, such as semiconductor wafers. Also, the terms screen and stencil may be used interchangeably herein to describe a device in a printer that defines a pattern to be printed onto a substrate. In certain embodiments, the stencil printer may include a Momentum® or an Edison™ series stencil printer platform offered by ITW Electronic Assembly Equipment of Hopkinton, Massachusetts. An exemplary stencil printer is generally designated at 5 in FIG. 1. In this embodiment, the stencil printer 5 is a Momentum® series stencil printer platform offered by ITW Electronic Assembly Equipment of Hopkinton, Massachusetts.

Figure 2:
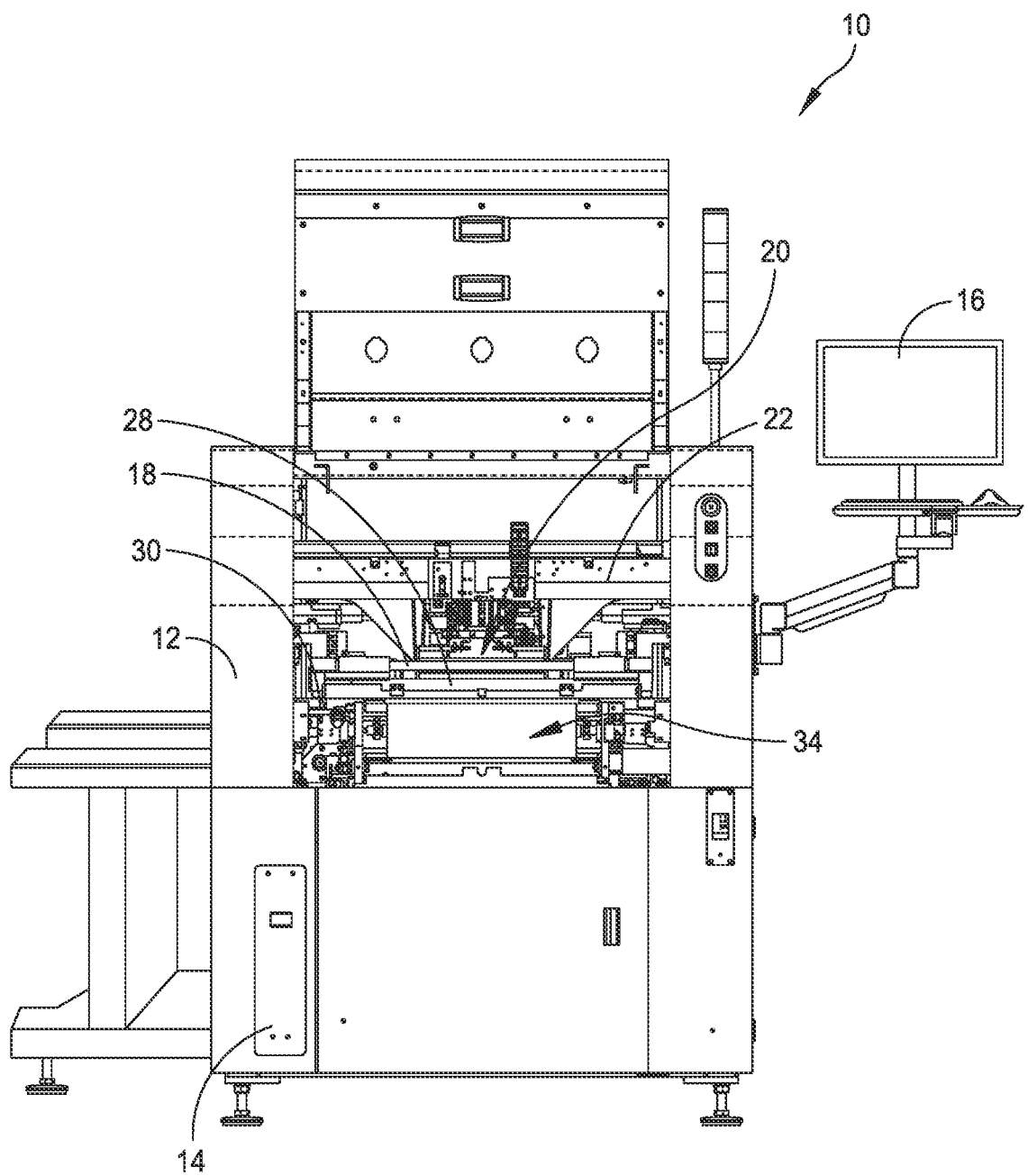
FIG. 2 is a front perspective view of a stencil printer.

Referring to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below.

As shown in FIG. 2 and described below, the stencil and the print head assembly may be suitably coupled or otherwise connected to the frame 12. In one embodiment, the print head assembly 20 may be mounted on a print head assembly gantry, generally indicated at 22, sometimes referred to as a "print head gantry," which may be mounted on the frame 12. The print head assembly 20 includes a print head having squeegee blades, which are configured to move across the stencil 18 during a print operation. Specifically, the print head is configured to dispense solder paste (or another viscous material) on the stencil 18 and the squeegee blades are configured to force the solder paste through apertures formed in the stencil. The print head gantry 22 enables the print head assembly 20 to be moved in the y-axis direction under the control of the controller 14 and to apply pressure on squeegee blades of the print head assembly as it engages the stencil 18. In a certain embodiment, the print head assembly 20 may be placed over the stencil 18 and may be lowered in the z-axis direction into contact and sealingly engage the stencil.

The stencil printer 10 may also include a conveyor system having rails (not shown) for transporting a printed circuit board (sometimes referred to as a "printed wiring board," "substrate," or "electronic substrate" herein) to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 3:
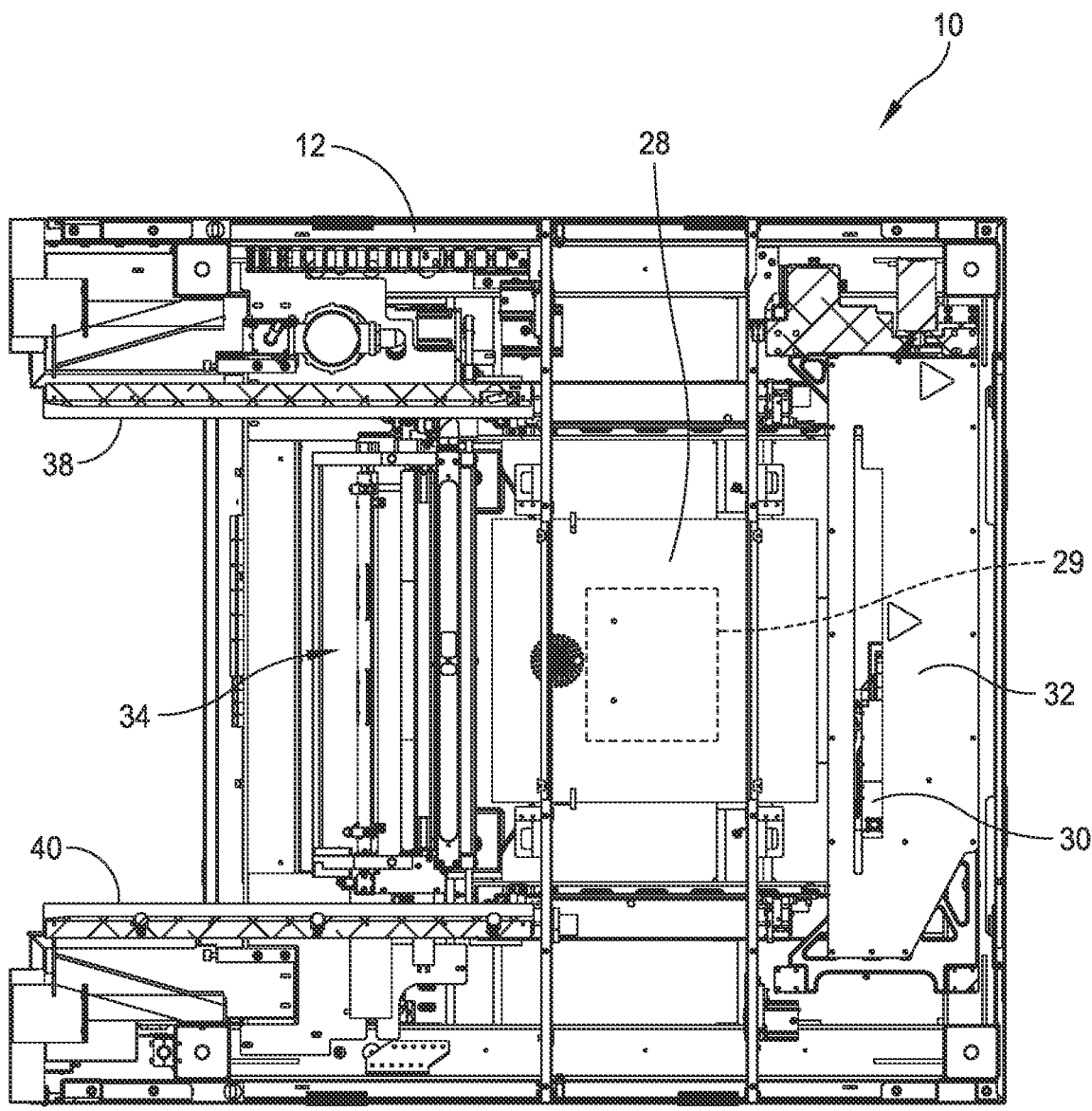
FIG. 3 is a top plan view of the stencil printer illustrated in FIG. 2 with portions removed.

Referring additionally to FIG. 3, the stencil printer 10 has a support assembly 28 to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, that provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

An imaging system 30 may be provided for the purposes of aligning the stencil 18 with the circuit board 29 prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back-and-forth movement of the imaging system 30 over the circuit board 29 in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board 29 to capture an image of predefined areas of the circuit board or the stencil, respectively.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

Figure 4:
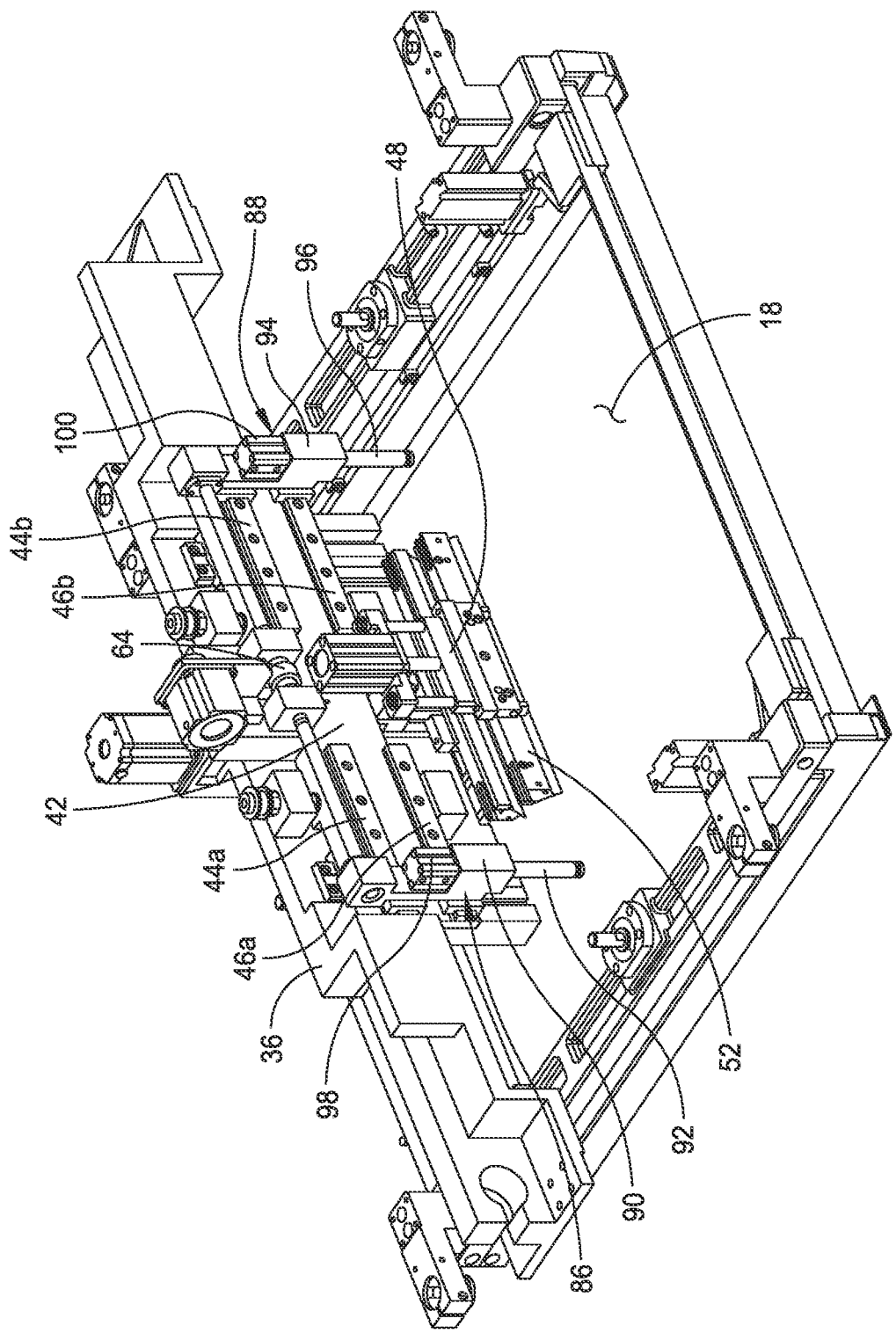
FIG. 4 is a perspective view of a print head assembly of an embodiment of the present disclosure.

Referring to FIG. 4, the print head assembly 20 is mounted on the print head gantry 22 to provide movement in the y-axis direction under the control of the controller 14. The print head gantry 22 includes an elongate beam 36 that rides along rails 38, 40 (FIG. 3) provided on the frame 12 of the stencil printer 10. The beam 36 includes a plate 42 having two groups of linear bearings 44, 46 that extend in a horizontal direction on the plate, with top linear bearings 44a, 44b being disposed above bottom linear bearings 46a, 46b. The purpose of the linear bearings 44a, 44b, 46a, 46b will be described in greater detail below. The print head assembly 20 includes a print head 48, which is coupled to the beam 36 of the print head gantry 22. Specifically, the print head 48 is mounted on a carriage 50 fixedly mounted on the plate 42. Thus, the print head gantry 22 provides movement of the print head 48 in the y-axis direction to perform the print strokes described herein. The print head 48 includes a squeegee blade assembly indicated at 52 to roll solder paste along the stencil in the manner described above. In one embodiment, the squeegee blade assembly 52 includes two squeegee blades, with viscous material, e.g., solder paste, disposed between the squeegee blades.

As mentioned above, solder paste can build up on squeegee blades of the squeegee blade assembly 52. Unwanted solder paste drip from the squeegee blades can contaminate the operational workspace of the stencil printer 10 during operation. For example, when changing a stencil, such as stencil 18, solder paste can drip off the squeegee blades onto the replacement stencil. Such contamination can cause defective printing operations on electronic substrates processed through the stencil printer. Aspects of the present disclosure are directed to collecting excess solder paste from squeegee blades of the squeegee blade assembly 52 during operation of the stencil printer 10.

Referring to FIGS. 5-9, embodiments of the print head assembly 20 further includes a squeegee drip collection system, which is configured to prevent unwanted solder paste from dripping from squeegee blades of the squeegee blade assembly 52 of the print head assembly 20 onto the stencil 18 during operation of the stencil printer 10. The squeegee drip collection system further is configured to remove a full or otherwise contaminated paste shield from the print head gantry of the stencil printer and install a new, clean paste shield.

Specifically, the squeegee drip collection system is capable of extending and retracting a collection device, such as a paste shield, under the squeegee blades to claim or collect solder paste that drips from the squeegee blades during downtime. For example, when replacing a stencil, such as stencil 18, the squeegee blades assembly 52 of the print head 48 are raised from the stencil and the paste shield of the squeegee drip collection system is deployed to collect and retain the solder paste that drips from the squeegee blades. Once the stencil 18 is replaced, the paste shield of the squeegee drip collection system is retracted to enable the squeegee blades from the print head 48 to be lowered onto the stencil 18. Once full, as mentioned above, the squeegee drip collection system is configured to automatically replace a full paste shield with a new, clean paste shield.

It should be understood that the squeegee drip collection system can be utilized during other operations, including replacing tooling on the substrate support assembly, replacing squeegee blades from the squeegee blade assembly, to name a few.

Figure 10:
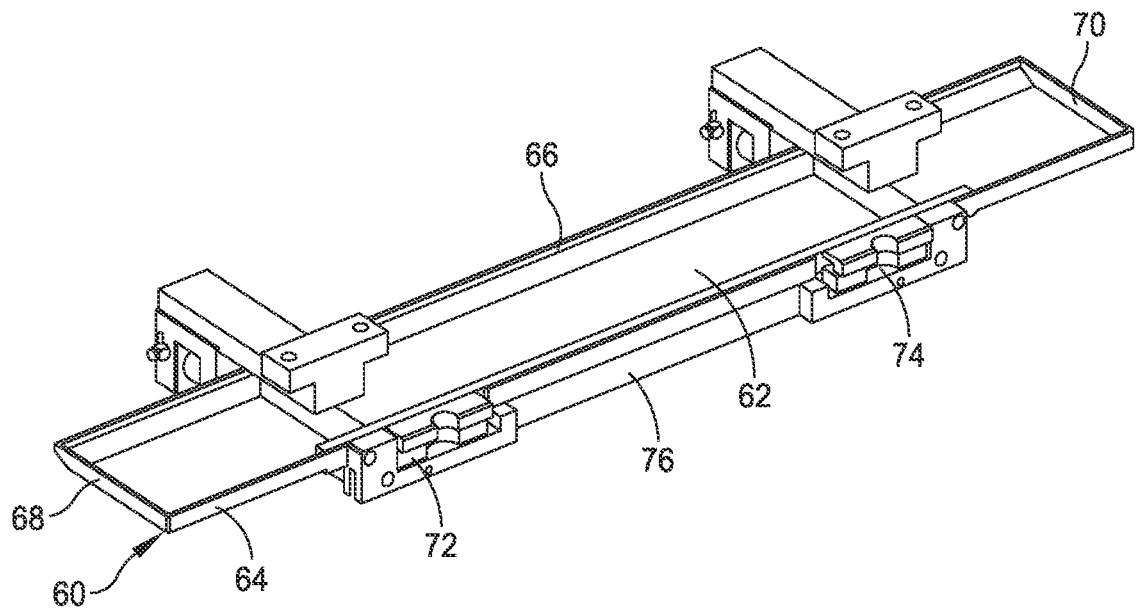
FIG. 10 is an enlarged perspective view of push pins configured to engage the paste shield.

Referring additionally to FIG. 10, the squeegee drip collection system includes a paste shield, generally indicated at 60, which can be coupled to the print head assembly 20 or the print head gantry 22. In one embodiment, the paste shield 60 includes a flat bottom wall 62, a front wall 64, a back wall 66 and two side walls 68, 70 that create a relatively shallow receptacle to receive solder paste from the squeegee blades of the squeegee blade assembly 52. In another embodiment, the paste shield 60 includes the bottom wall 62 only. The front wall 64 includes first and second receiving features 72, 74 that each extends beyond a peripheral edge of the front wall. In one embodiment, the receiving features 72, 74 are part of a structure 76 that is secured to the paste shield 60. The purpose of the receiving features 72, 74 will be described in greater detail as the description of the squeegee drip collection system proceeds. As shown, the paste shield 60 has a length that generally corresponds with or is slightly longer than a length of the squeegee blades of the squeegee blade assembly 52. The length and width of the paste shield 60 can be determined based on the size and shape of the squeegee blades of the squeegee blade assembly 52.

In one embodiment, the squeegee drip collection system further includes at least one extension mechanism that is used to extend the paste shield 60 under the squeegee blades of the squeegee blade assembly 52 during operation. In the shown embodiment, two, spaced apart extension mechanisms, generally indicated at 80, 82, are provided to releasably secure and laterally move the paste shield 60 under the squeegee blades of the squeegee blade assembly 52. Specifically, the extension mechanisms 80, 82 are configured to be received in third and fourth receiving features provided in the bottom wall 62 or in the support structure 76 of the paste shield, which are positioned adjacent the first and second receiving features 72, 74, respectively.

Figure 5:
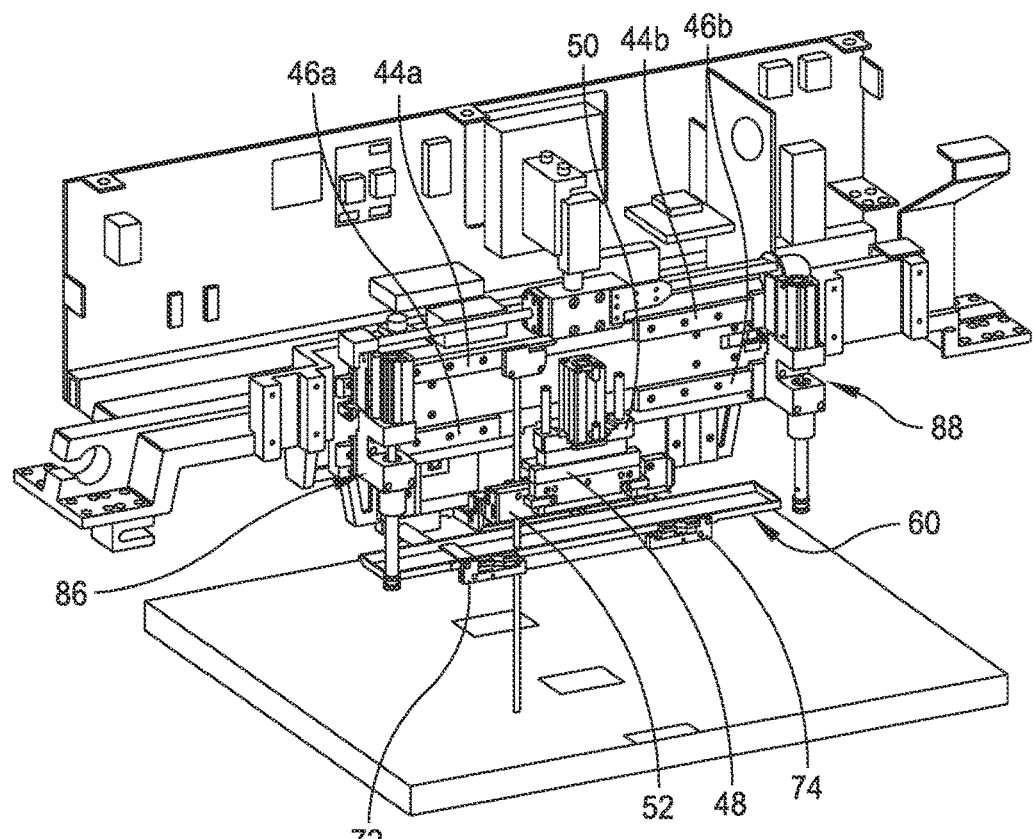
FIG. 5 is a perspective view of the print head assembly having tooling members configured to engage a paste shield provided on a support.
Figure 6:
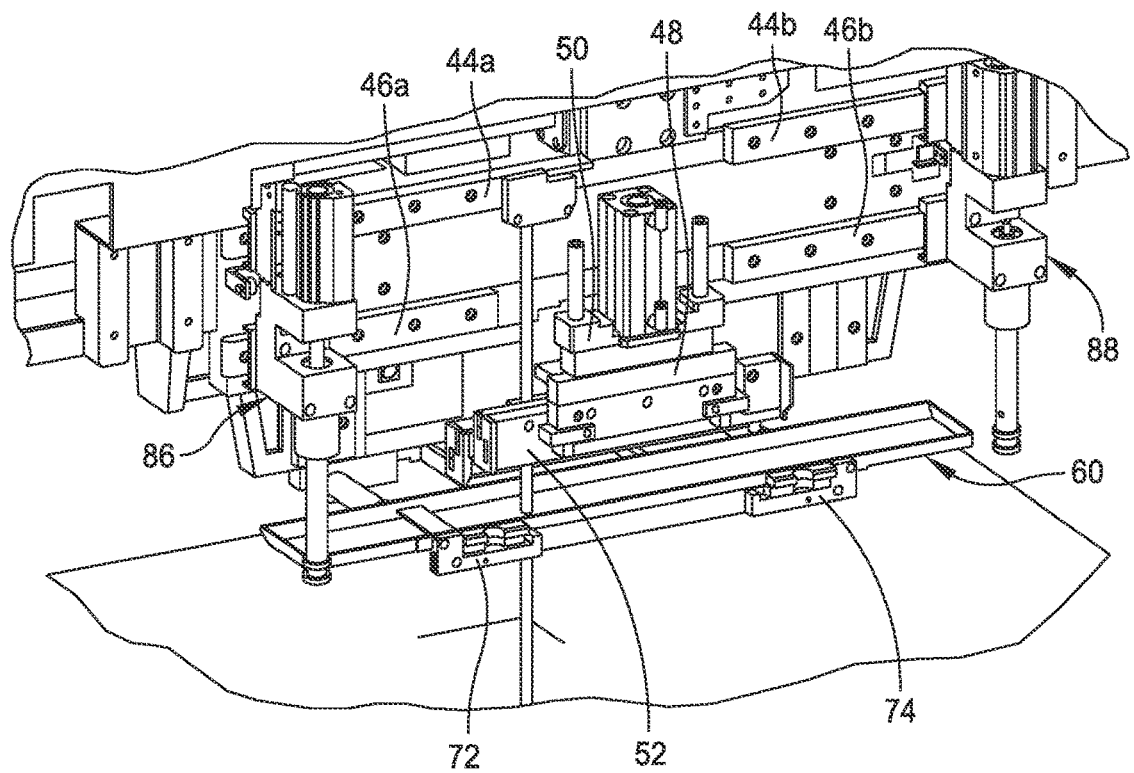
FIG. 6 is an enlarged perspective view of the tooling members of the print head assembly shown in FIG. 5.

FIGS. 5 and 6 illustrate the extension mechanisms 80, 82 extending the paste shield 60 to the extended position to position the paste shield under the squeegee blades of the squeegee blade assembly 52. The extension mechanisms 80, 82 are configured to retract the paste shield 60 to enable the squeegee blade assembly 52 to be lowered onto the stencil 18 without interfering with the squeegee blade assembly. The construction of each extension mechanism 80, 82 and the third and fourth receiving features will be described with reference to FIGS. 13A-13C.

Referring back to FIGS. 5-9, the collection system further includes the plate 42 that is mounted on the print head gantry 22. The plate 42 includes the two pairs of linear bearings 44a, 44b and 46a, 46b. As shown, linear bearings 44a, 46a are configured to support a first tooling member, generally indicated at 86, and linear bearings 44b, 46b are configured to support a second tooling member, generally indicated at 88, with the tooling members being configured to move laterally on their respective pairs of linear bearings.

Any suitable mechanism can be employed to move the tooling members 86, 88 laterally along the linear bearings 44a, 46a and 44b, 46b, respectively. For example, in one embodiment, a ball screw drive assembly can be employed to move the tooling members 86, 88 along the linear bearings 44a, 46a and 44b, 46b, respectively. In some embodiments, the ball screw drive assembly provided to move the tooling members 86, 88 along the linear bearings 44a, 46a and 44b, 46b, respectively, can also power an up-and-down movement of the print head 48 in the z-axis direction. As mentioned above, the print head 48 of the print head assembly 20 is configured to be lowered to engage the stencil 18 during a print operation and raised to disengage the stencil when not performing a print operation. When lowered, the print head 48 applies pressure on the squeegee blade assembly 52 as the squeegee blade assembly sealingly engages the stencil 18.

Figure 11:
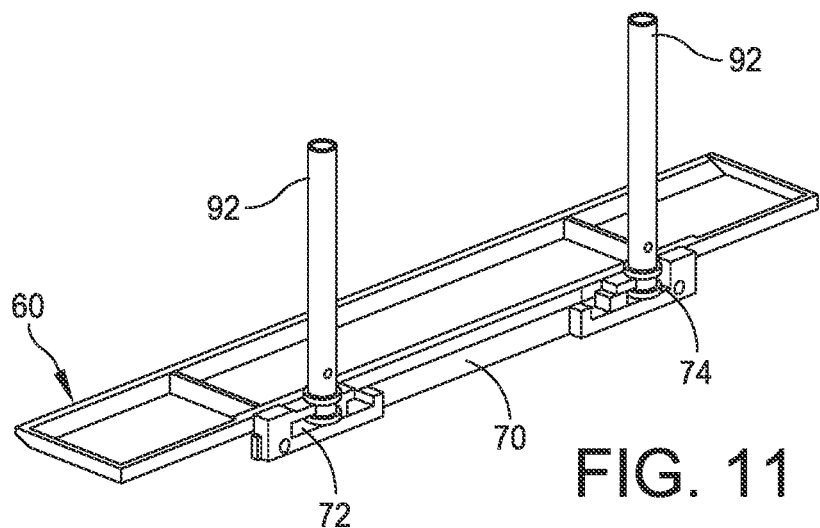
FIG. 11 is an enlarged perspective view of tooling members supporting the paste shield.

Referring to FIGS. 10 and 11, the first tooling member 86 includes a first housing 90 secured to linear bearings 44a, 46a, with the first housing being configured to ride along the linear bearings in lateral directions. The first tooling member 86 further includes a first downwardly extending pin 92 disposed in a first pneumatic cylinder 98 mounted on the first housing 90, the first pin having an end configured to be received within one of the receiving features, e.g., the first receiving feature 72, of the paste shield 60 described in greater detail below.

Similarly, the second tooling member 88 includes a second housing 94 secured to linear bearings 44b, 46b, with the second housing being configured to ride along the linear bearings in lateral directions. The second tooling member 88 further includes a second downwardly extending pin 96 disposed in a second pneumatic cylinder 100 mounted on the second housing 94, the second pin having an end configured to be within the other receiving feature, e.g., the second receiving feature 74, of the paste shield 60. The receiving features 72, 74 of the paste shield 60 are configured to be engaged by the pins 92, 96 of the first and second tooling members, 86, 88, respectively, to engage and move the paste shield.

The first pneumatic cylinder 98 and the second pneumatic cylinder 100 are configured to drive the up-and-down movement of the first pin 92 within the first housing 90 and the second pin 96 within the second housing 94, respectively. The first pneumatic cylinder 98 and the second pneumatic cylinder 100 are coupled to the controller 14 and a pneumatic source to control the up-and-down movement of the pins 92, 96 independently of one another.

Figure 7:
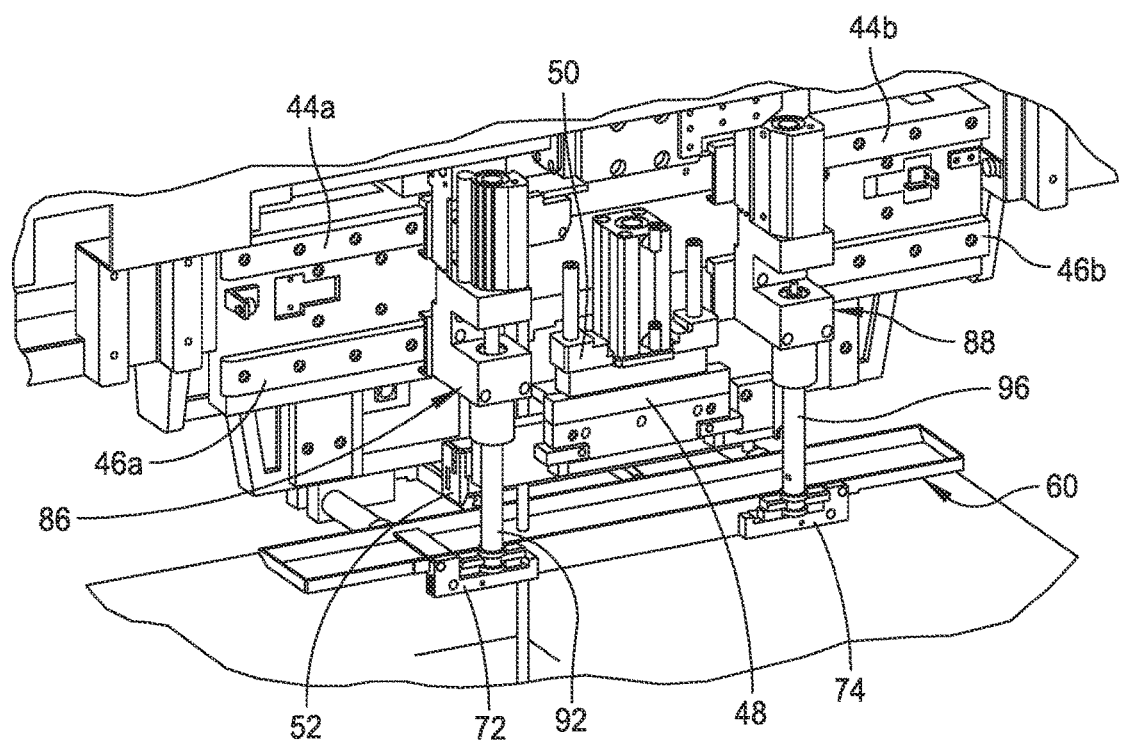
FIG. 7 is a top perspective view of the tooling members engaging the paste shield, with push pins being used to move the paste shield.
Figure 8:
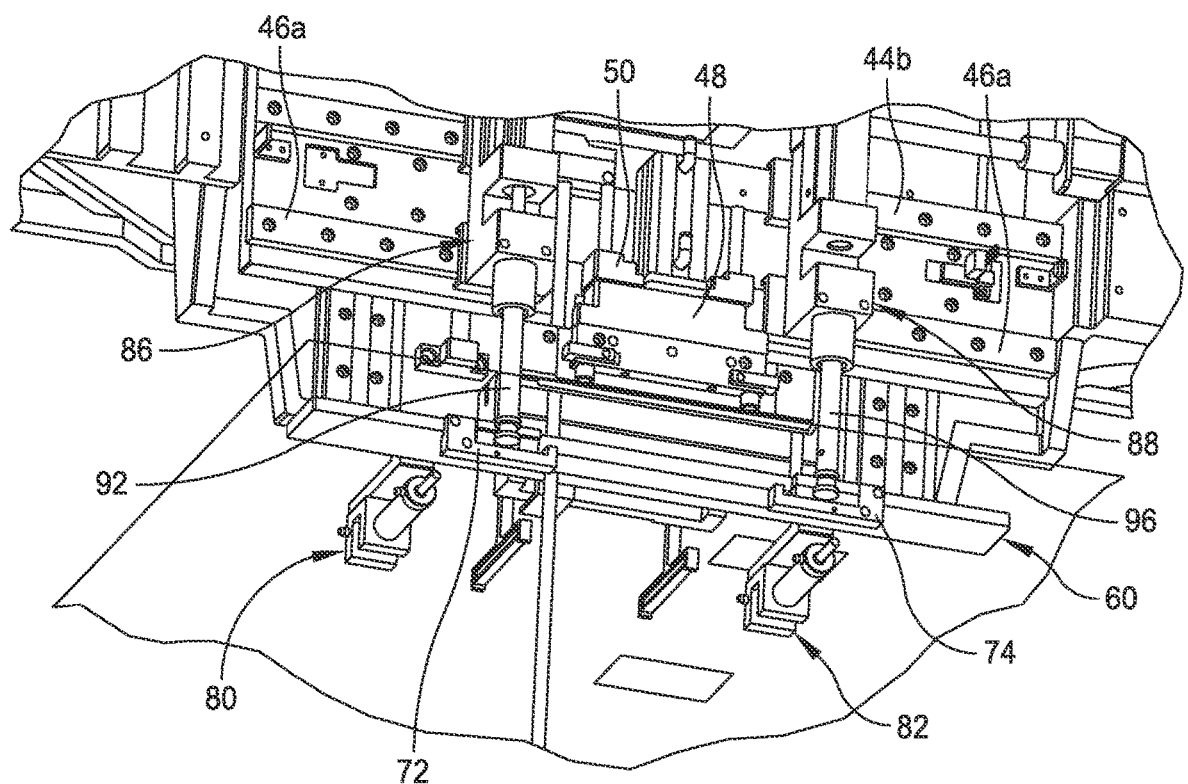
FIG. 8 is a bottom perspective view of the tooling members engaging the paste shield shown in FIG. 7.
Figure 9:
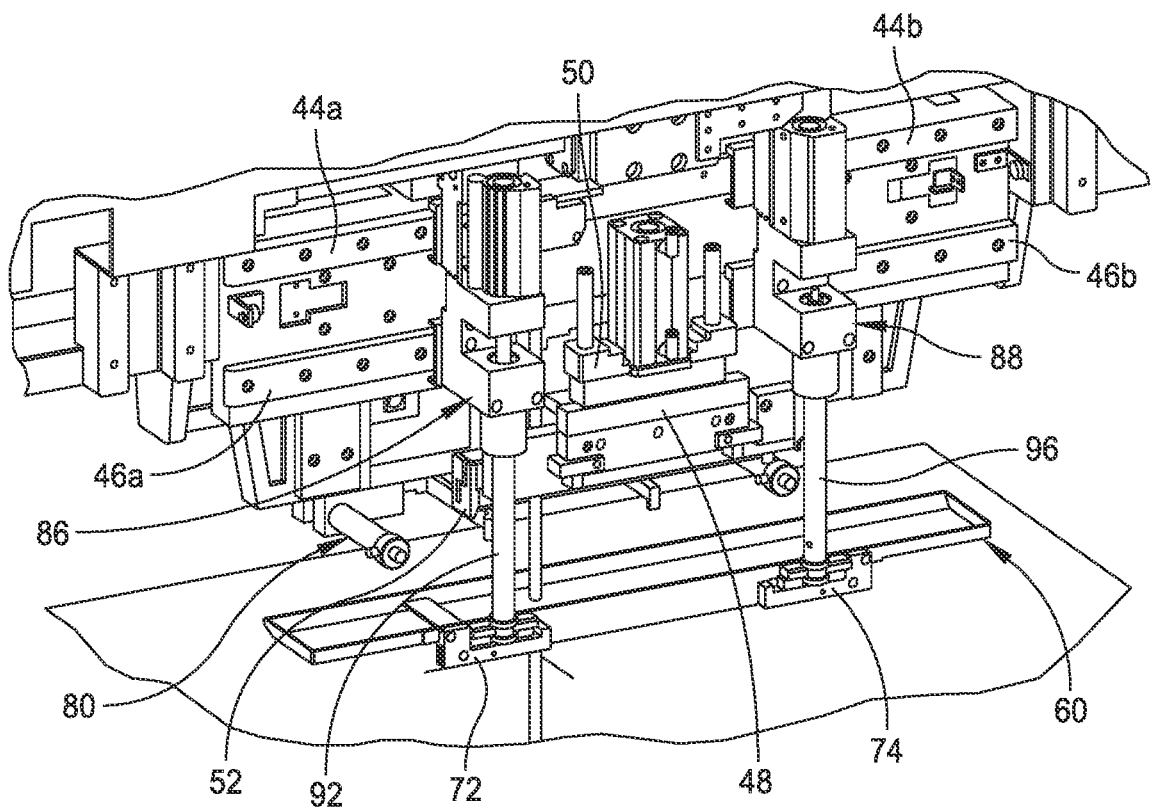
FIG. 9 is a perspective view of the tooling members supporting the paste shield.

In one embodiment, referring to FIG. 7, the pins 92, 96 of the tooling members 86, 88 are received in respective first and second receiving features 72, 74 of the paste shield 60. The tooling members 86, 88 can be moved to a width that is approximate to a width of the first and second receiving features 72, 74 of the paste shield 60. Once positioned in front of the first and second receiving features 72, 74 of the paste shield 60, the paste shield is moved toward the tooling members 86, 88 by the extension mechanisms 80, 82 so that the ends of the tooling members are received within respective receiving features of the paste shield to secure the paste shield to the tooling members. The tooling members 86, 88 can be positioned by moving them along the linear bearings 44a, 46a and 44b, 46b, respectively. Further, the pins 92, 96 of the tooling members 86, 88 can be lengthened or shortened to achieve a proper elevation of the ends of the pins with respect to the first and second receiving features 72, 74. The print head assembly 20 is configured to be moved in the y-axis direction by the print head gantry 22 to engage and move the paste shield 60. This position shown in FIGS. 8 and 9.

It should be understood that the pins of the tooling members 86, 88 can employ various mechanisms used to engage and move the paste shield 60. In the shown embodiment, the pins 92, 96 of the tooling members 86, 88 have ends that are respectively received in the first and second receiving features 72, 74 of the paste shield 60. For example, the pins 92, 96 of the tooling members 86, 88 can each include magnets to facilitate attachment and detachment of the paste shield from the tooling members to lift and move the paste shield 60.

Figure 12A:
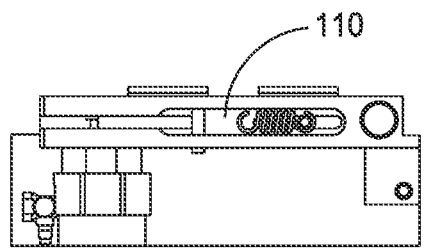
FIGS. 12A-12C are views shown aspects of the paste shield.
Figure 12B:
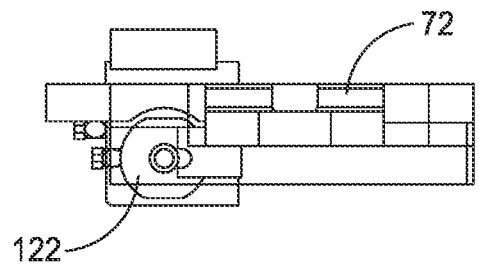
Figure 12C:
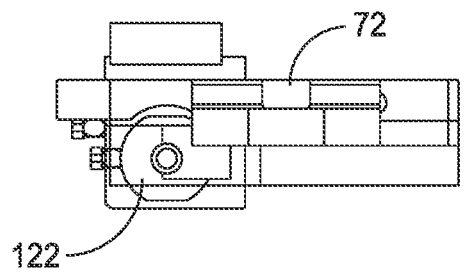

Referring to FIGS. 12A-12C, as mentioned above, the tooling members 86, 88 can be configured to pick up and release the paste shield 60. Specifically, the tooling members 86, 88 are configured to toolessly engage and disengage the first and second receiving features 72, 74 of the paste shield 60 to disengage the paste shield from the extension mechanisms 80, 82 and to secure and remove the paste shield. As will be described in greater detail below, the paste shield 60 can be configured with a spring-loaded locking mechanism to secure the paste shield to the extension mechanisms 80, 82. A method of passively picking up and dropping off the paste shield 60 without needing additional axes or actuators can be performed by the tooling members 86, 88.

As shown in FIG. 12A, for both pins 92, 96 of tooling members 86, 88, as the end of the pin enters a recess of its respective receiving feature 72 or 74, the pin causes a spring-loaded mechanism 110 to move against the bias of a spring to release the extension mechanism 80 or 82 from the paste shield 60. Thus, the arrangement is such that as the ends of the pins 92, 96 enter their respective third and fourth receiving features, the extension members 80, 82 are released from the third and fourth receiving features. Once positioned, the pins 92, 96 of the tooling members 86, 88 are secured to the paste shield 60 to support the paste shield as the extension mechanisms 80, 82 are extricated from the paste shield.

Figure 13A:
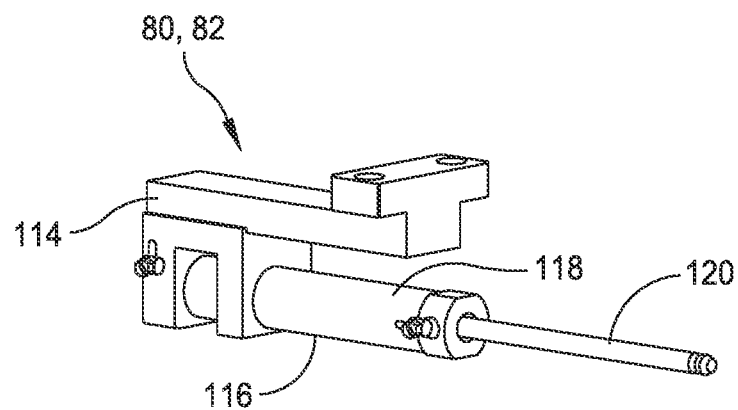
FIGS. 13A-13C are views showing aspects of the push pin.
Figure 13B:
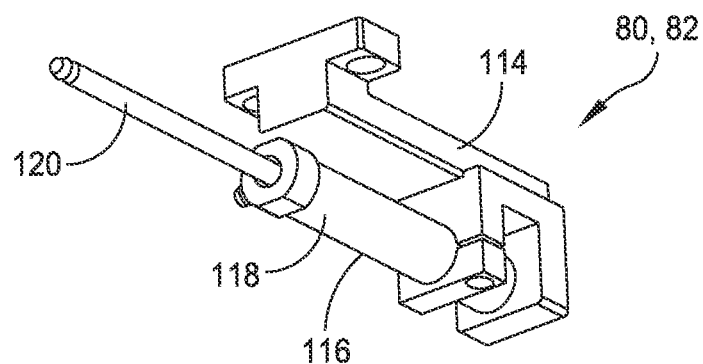
Figure 13C:
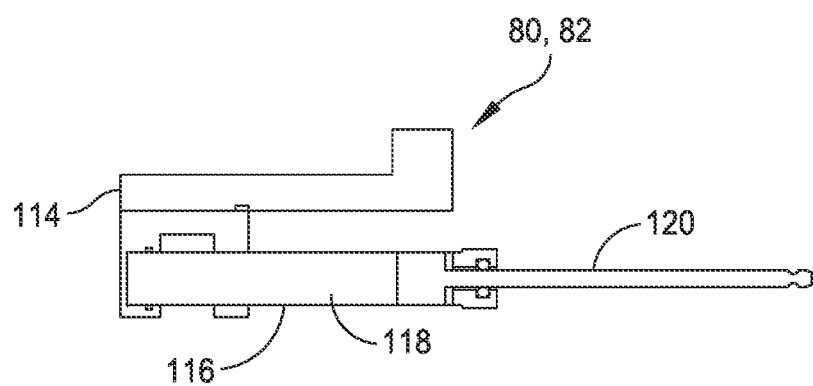

Referring to FIGS. 13A-13C, each extension mechanism 80, 82 includes a bracket 114 that is secured to the carriage 50 of the print head gantry 22 and an extension member 116 that is mounted on the bracket. As shown, in one embodiment, the extension member 116 includes a cylinder 118 mounted to the bracket 114 and a rod 120 that is reciprocally received within the cylinder. An air supply (not shown) can be connected to the cylinder 118 to provide the reciprocating movement of the rod 120 within the cylinder. The rods 120 of the extension members 80, 82 are used to extend and retract the paste shield 60 under the squeegee blade assembly 52.

Each rod 120 further can be configured to include an end that is received within the respective third and fourth receiving features of the paste shield 60. FIG. 12B illustrates the end of the rod 120 configured to be removed from a receiving feature 122 of the paste shield 60. FIG. 12C illustrates the end of the rod 120 configured to be captured by the receiving feature 122 of the paste shield 60.

Embodiments of the present disclosure include a method of capturing solder paste that potential can drip from squeegee blades of the squeegee blade assembly 52 of the print head 48 during operation. In one embodiment, the method includes moving the paste shield 60 from a retracted position to an extended position under the squeegee blades of the squeegee blade assembly 52. The method further includes the ability to replace the paste shield 60 by use of the tooling members 86, 88.

In one embodiment, a method of removing the paste shield 60 from the squeegee blade assembly 52 includes positioning the tooling members 86, 88 adjacent the receiving features 72, 74 of the paste shield, moving the paste shield 60 toward the tooling members by 86, 88 the extension mechanisms 80, 82, positioning the tooling members 86, 88 within respective receiving features 72, 74 to release the paste shield 60 from the extension mechanisms 80, 82, and supporting the paste shield 60 with the tooling members 86, 88. Although two tooling members 86, 88, two receiving features 72, 74 and two extension members 80, 82 are shown and described herein, any number of tooling members, receiving features and extension members can be provided to perform the methods described herein.

The system and related methods disclosed herein may be performed under the control of controller 14. Specifically, the controller 14 can be configured to know when to move the paste shield and when to replace the paste shield.

In some embodiments, existing stencil printer gantries, rails and print head of the stencil printer 10 can be configured to shuttle items in and out, including the paste shield.

In some embodiments, the print head assembly 20 of the stencil printer 10 can be configured to move and shuttle a paste shield.

As used herein, an "automated" or "fully automated" changeover describes the replacement or replenishment of an item without human intervention.

As used herein, a "partially automated" changeover describes the replacement or replenishment of an item with some or limited human intervention.

As used herein, "transport" or "transporting" describes moving an item from one position to another, either manually or with a machine.

As used herein, "install" or "installing" describes the process of placing an item in a position ready for use.

As mentioned above, the movable cart can be employed to replace other items within the stencil printer. For example, the stencil wiper assembly includes consumables, e.g., paper and solvent, which can be automatically replaced by the movable cart.

The concepts disclosed herein may be employed in other types of equipment used to fabricate electronic substrates, including dispensers, pick-and-place machines, reflow ovens, wave soldering machines, selective solder machines, inspection stations, and cleaning stations. For example, the concepts directed to recapturing materials can be employed in soldering and wave soldering machines and in cleaning stations.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A method of removing a paste shield configured to collect assembly material from a squeegee of a print head gantry, the method comprising:
    positioning at least one tooling member adjacent at least one receiving feature of a paste shield, the at least one tooling member being configured to move laterally on the at least one linear bearing, the at least one tooling member including a downwardly extending pin having an end configured to be received within a receiving feature associated with the paste shield to engage and move the paste shield;
    moving the paste shield toward the at least one tooling member by at least one extension mechanism;
    positioning the at least one tooling member within the at least one receiving feature of the paste shield to release the paste shield from the at least one extension mechanism; and
    supporting the paste shield with the at least one tooling member,
    wherein the at least one tooling member is configured to move laterally on the at least one linear bearing.

2. The method of claim 1, wherein positioning the at least one tooling member within the at least one receiving feature includes positioning the downwardly extending pin of the at least one tooling member within the receiving feature and triggering a spring-loaded locking mechanism to release the paste shield from the at least one extension mechanism.

3. The method of claim 1, wherein the at least one tooling member includes two spaced-apart tooling members, each including a pin, and wherein the at least one receiving feature includes two receiving features, the two tooling members being received in respective receiving features of the paste shield to secure the paste shield.

4. The method of claim 1, wherein the at least one extension mechanism includes a bracket secured to the print head gantry and an extension member that is mounted on the bracket.

5. The method of claim 4, wherein the at least one extension member includes a cylinder mounted to the bracket and a rod that is reciprocally received within a piston, each rod having a head that is received within a receiving feature of the paste shield.

6. The method of claim 5, wherein the paste shield is configured with a spring-loaded locking mechanism to secure the paste shield to the at least one extension mechanism.

7. The method of claim 1, wherein the at least one tooling member includes two spaced-apart tooling members, each including a pin, a first tooling member being configured to move laterally on a first linear bearing and a second tooling member being configured to move laterally on a second linear bearing.

8. The method of claim 7, wherein the at least one receiving feature includes two receiving features, one for each tooling member, the first and second tooling members being received in respective receiving features of the paste shield to releasably secure the paste shield.

9. The method of claim 1, wherein the paste shield includes a flat bottom wall, a front wall, a back wall and two side walls that create a shallow receptacle to receive solder paste from the at least one squeegee blade.

10. The method of claim 1, wherein the at least one extension mechanism is configured to move the paste shield between the retracted position and the extended position.

11. The method of claim 1, further comprising controlling the print head gantry with a controller coupled to the print head gantry, the controller being configured to control the movement of the at least one tooling member.

* * * * *